United States Patent [19]

Li

[11] Patent Number: 5,681,397

[45] Date of Patent: Oct. 28, 1997

[54] METHODS FOR HIGH TEMPERATURE WATER RINSING AND DRYING OF SILICON WAFERS AFTER BEING CLEANED IN HYDROFLUORIC ACID

[75] Inventor: Li Li, Meridian, Id.

[73] Assignee: Micron Technology, Inc., Boise, Id.

[21] Appl. No.: 527,339

[22] Filed: Sep. 12, 1995

[51] Int. Cl.⁶ .................................................. C03C 23/00
[52] U.S. Cl. ............................ 134/2; 134/3; 134/26; 134/28
[58] Field of Search ............................ 134/2, 3, 26, 28

[56] References Cited

U.S. PATENT DOCUMENTS 4,716,050  12/1987  Green et al. ............................ 427/99

OTHER PUBLICATIONS

Nayami et al, Removal of Metallic contaminants and Native oxide Prom silicon wafer surface by pure water containing a little dissolved Oxygen Mat. Res. Soc. Symp. Proc. vol. 386, pp. 69–74, Apr. 1995.
Li et al. Surface Passivation and Microroughness of (100) Silicon Etched in Aqueous Hydrogen Halide (HF, HCI HB, HI) Solutions., J. Appl. Phys., 77(3), 1 Feb. 1995, 1323–1325.
Handbook of Semiconductor Wafer Cleaning Technology Edited by Werner Kern, Noyes Publications, 1993, pp. 134–135.

*Primary Examiner*—Robert J. Warden
*Assistant Examiner*—Alexander Markoff
*Attorney, Agent, or Firm*—Workman, Nydegger and Seeley

[57] ABSTRACT

Methods are disclosed for rinsing and drying of a silicon wafer. The methods involve cleaning the silicon wafer with hydrofluoric acid, immersing a silicon wafer in either boiling deionized water or a boiling hydrochloric acid solution, and then drawing the silicon wafer to dry from the boiling deionized water or the boiling aqueous hydrochloric acid solution. The aqueous hydrochloric acid solution preferably has a pH value of about 2.5. Oxidation of the surfaces of a silicon wafer is minimized by immersing the silicon wafer in either boiling water or a boiling aqueous hydrochloric acid solution thereby yielding a wafer having surfaces which are oxide free. A silicon wafer boiled in an aqueous hydrochloric acid solution experiences minimal surface roughening and has relatively smooth surfaces.

12 Claims, 5 Drawing Sheets

METHODS FOR HIGH TEMPERATURE WATER RINSING AND DRYING OF SILICON WAFERS AFTER BEING CLEANED IN HYDROFLUORIC ACID

BACKGROUND OF THE INVENTION

1. Field of the Invention

The present invention is directed to methods for high temperature water rinsing and drying of silicon wafers after being cleaned with hydrofluoric acid. More particularly, the methods involve treating a silicon wafer with HCl added to boiling water after the wafer has been exposed to hydrofluoric acid in order to provide an oxide free and smooth silicon surface.

2. The Relevant Technology

In the microelectronics industry, methods for cleaning silicon wafers are continually being developed and optimized to meet the stringent demands for wafers having clean and smooth surfaces. As the device features continuously decrease to the deep sub-micron region, the product yield and device performance become even more dependent on the wafer cleaning technology.

One of the most frequently used chemicals in wafer cleaning is hydrofluoric (HF) acid. HF treatment removes thermal and native oxides and is therefore an essential processing step of device fabrication and in particular also a basic component of all kinds of cleaning procedures. HF treatment of silicon wafers by HF-last cleaning techniques has been the main approach over the last few years for realizing ultraclean silicon wafers. Prior to oxide removal with HF or the HF-last pre-diffusion clean, the silicon wafers are normally proceeded by particle and organic removal steps.

It is well known that the HF-last clean is an attractive way to obtain reduced surface roughening and low metallic contamination on silicon surfaces. HF-last processing, however, is very susceptible to particle contamination. Wafer drying techniques play a critical role in reducing the particle attraction to the hydrophobic silicon surface. Some prior art wafer drying techniques used in manufacturing use centrifugal spin drying, IPA drying and the TREBOR Hydrodry™ technique. Prior art wafer drying techniques, such as the TREBOR Hydrodry™ technique, take advantage of the capillary action of heated water when hot water immersed wafers are slowly pulled to air at a controlled rate.

HF-treated silicon surfaces are found to be almost completely hydrogen terminated. After the wafers have been treated with hydrofluoric acid, the wafers are rinsed in deionized (DI) water. The surfaces of HF-treated wafers are easily attacked by oxidants such as OH⁻ radicals during extended deionized water rinsing which results in reoxidation of the silicon surfaces. The reoxidation is accelerated in hot DI water.

Hot deionized water having a temperature of about 85° C. increases the chemical solubilities and reduces the boundary layer effect on the wafer surface, thereby decreasing the rinse time. Rinsing in hot water provides enhanced etching with an anisotropic etch rate; however, hot water rinsing also results in roughening on Si(100) surfaces. Despite the roughening effect on Si(100) surfaces, several commercialized drying techniques are on the market now which use water rinses at elevated temperatures.

There are no methods currently available which provide for high temperature water rinsing and drying of silicon wafers after being cleaned in HF that result in minimal reoxidation and minimal roughening of the silicon surface.

SUMMARY AND OBJECTS OF THE INVENTION

The present invention is directed to methods for high temperature water rinsing and drying of a silicon wafer after being cleaned with hydrofluoric acid. More particularly, the methods involve treating a silicon wafer with boiling water after the wafer has been exposed to hydrofluoric acid in order to provide an oxide free silicon surface. The boiling water is preferably spiked with sufficient hydrochloric acid (HCl) to yield an aqueous hydrochloric acid solution having a pH value of about 2.5.

The methods of the present invention comprise the steps of immersing a silicon wafer in a boiling hydrochloric acid solution and then drawing the silicon wafer from the boiling aqueous hydrochloric acid solution to dry at a controlled rate.

Immersing a silicon wafer in boiling water suppresses reoxidation of the silicon surfaces; however, it also roughens the surfaces. The roughening effect of the boiling water on the surfaces of the silicon wafer is minimized by adding sufficient hydrochloric acid to water to yield an aqueous hydrochloric acid solution having a pH of about 2.5.

Oxidation of the surfaces of a silicon wafer is minimized by immersing a silicon wafer in either boiling water or a boiling aqueous hydrochloric acid solution thereby yielding a wafer having surfaces which are oxide free. A wafer treated by the methods of the present invention has surfaces with no more oxides than after the silicon wafer has been cleaned in an aqueous hydrofluoric acid solution. The methods of the present invention yield wafers which are sufficiently oxide free that a droplet of deionized water on one of the surfaces of a silicon wafer has a contact angle of about 70°. It is postulated that the large amounts of gaseous water bubbling to the surface from either the boiling water or boiling aqueous hydrochloric acid solution effectively remove the oxygen from the water and prevent the reentry of the oxygen.

The surface roughening due to the etching reaction of water can be effectively suppressed by adding a small amount of hydrochloric acid to control the OH⁻ concentration such that the surfaces of a silicon wafer boiled in aqueous hydrochloric acid have a rms roughness of less than about 0.2 nm. A silicon wafer boiled in an aqueous hydrochloric acid solution having a pH level of about 2.5 has no more microroughness on the surfaces of the silicon wafer after the silicon wafer has been immersed in the boiling aqueous hydrochloric acid solution and drawn from the boiling aqueous hydrochloric acid solution than after the silicon wafer has been cleaned in an aqueous hydrofluoric acid solution.

From the foregoing it will be appreciated that an object of the present invention is to provide methods for rinsing and drying a silicon wafer without oxidizing the surfaces of the silicon wafer.

It is also an object of the present invention to provide methods for rinsing and drying a silicon wafer with minimal reoxidation and roughening of the surfaces of the silicon wafer.

These and other objects and features of the present invention will become more fully apparent from the following description and appended claims, or may be learned by the practice of the invention as set forth hereinafter.

BRIEF DESCRIPTION OF THE DRAWINGS

In order to understand the manner in which the above-recited and other advantages and objects of the invention are obtained, a more particular description of the invention briefly described above will be rendered by reference to the appended drawings. Understanding that these drawings depict only a typical embodiment of the invention and are not therefore to be considered to be limiting of its scope, the invention will be described and explained with additional specificity and detail through the use of the accompanying drawings listed hereinbelow.

DETAILED DESCRIPTION OF THE PREFERRED EMBODIMENTS

Figure 1:
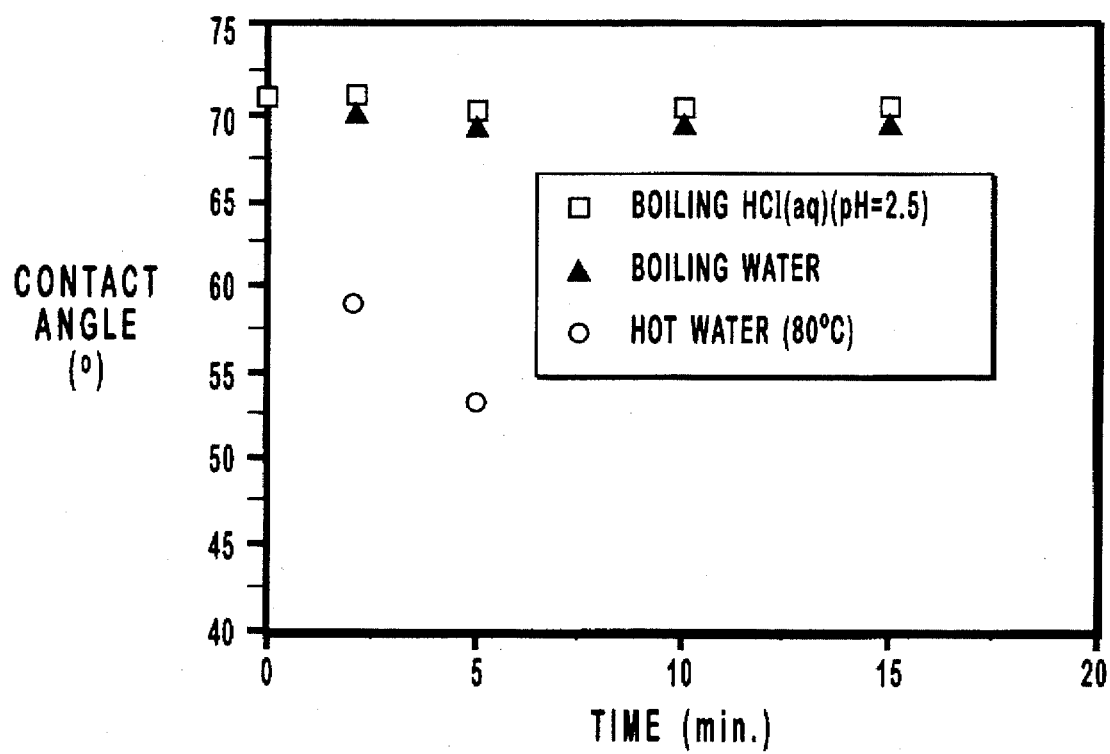
FIG. 1 is a graph measuring the contact angle as a function of treatment time to indicate the oxidation state of the surface of a wafer being treated in either hot water having a temperature of about 80° C., boiling water, or an aqueous solution of hydrochloric acid having a pH level of about 2.5.

The present invention is directed to methods for high temperature water rinsing and drying of silicon wafers after being cleaned with hydrofluoric acid. More particularly, the methods involve treating a silicon wafer with boiling water after the wafer has been exposed to hydrofluoric acid in order to provide an oxide free silicon surface. The boiling water is preferably spiked with sufficient hydrochloric acid (HCl) to yield an aqueous hydrochloric acid solution having a pH value of about 2.5. The benefits of the methods of the present invention include an oxide free Si surface with minimal roughening of the surface.

Immersing silicon wafers in boiling water suppresses reoxidation of silicon surfaces; however, it also roughens the surfaces. The roughening effect of the boiling water on the surfaces of silicon wafers is minimized by adding sufficient hydrochloric acid to water to yield an aqueous hydrochloric acid solution having a pH of about 2.5.

Oxidation of the surfaces of silicon wafers is minimized by immersing silicon wafers in either boiling water or a boiling aqueous hydrochloric acid solution. The methods of the present invention preferably yield wafers having surfaces with no more oxides than after the silicon wafers have been cleaned in an aqueous hydrofluoric acid solution. The methods of the present invention yield wafers which are sufficiently oxide free that a droplet of deionized water on one of the surfaces of a silicon wafer has a contact angle of about 70°.

It has been found that the native oxide growth rate on the wafer surface is dependent on the amount of dissolved oxygen within the water. Accordingly, removal of the oxidizing species responsible for the silicon surface oxidation from the water eliminates the possibility of reoxidation during the rinsing and drying step. It is postulated that the suppression of the reoxidation of the silicon surface in boiling water results from the large amounts of gaseous water bubbling to the surface which effectively pushes the oxygen out of the water. The out diffusion of the dissolved oxygen from the water is in accordance with Henry's law. Re-entry of the oxygen in the region of the gas/liquid interface is prevented by the escaping gaseous water at the water surface. The removal of the dissolved oxygen from the boiling water prevents reoxidation of the HF cleaned silicon surface.

Prior art methods of rinsing wafers in water after cleaning in aa aqueous hydrofluoric acid solution do not use boiling water and do not yield oxide free silica surfaces. When HF cleaned silicon wafers are treated with hot water, having a temperature of about 80° C., a certain amount of oxygen will be present in the hot water since there is no gas bubbling. The higher temperature speeds up the surface reaction, resulting in a faster reoxidation in the hot water than when room temperature water is used. Since faster reoxidation occurs in hot water than in room temperature water, one of ordinary skill in the art would not be inclined to further increase the temperature until the water boils.

The behavior of silicon surfaces varies significantly in boiling water, when compared to hot water having a temperature of about 80° C., and to room temperature water. A fast surface reoxidation on silicon surfaces is observed in hot water having a temperature of about 80° C., and a slow surface reoxidation is observed in room temperature water, while boiling water treatment yields a rapid etching removal with H-termination. It seems unlikely that the continuous H-passivation observed in boiling water compared to the reoxidation observed in hot water and room temperature water can be explained by the different activation barriers of the individual and chemical pathways.

In room temperature water, a surface etch does not stop when the native oxide starts to build up on the silicon surface. It has been shown that the Si dissolution rate in water is over one order of magnitude higher than the native oxide growth rate. Additionally, the vastly different surface processes observed in boiling water treatment and hot water treatment are most likely not caused by the activation barriers since the temperature range of about 80° C. to about 100° C. is relatively small. It seems more likely that the absence of reoxidation on the silicon surface in boiling water is explained by the significant decrease of dissolved oxygen in the boiling water.

The anisotropic etching of Si (100) surfaces by methods of the present invention is enhanced compared to the etching achieved with room temperature water treatment. This enhancement can be partially attributed to the temperature dependance of the surface reaction rate. An additional, previously unrecognized, factor is the strong temperature dependance of the self-ionization of water. The negative logarithm of the ionization constant of water $-\log K_w$ (where $K_w$ equals $[H^+][OH^-]$), changes from 14.133 at 20° C. to 12.265 at 100° C. Assuming equal [H$^+$] and [OH$^-$] in pure water, the OH$^-$ concentration is about one order of magnitude higher in boiling water than in room temperature water. It is postulated that the higher OH$^-$ concentration in the boiling water accelerates the anisotropic etching and leaves a rough Si(100) surface by (111) microfacetting.

The reaction mechanism of water on HF-cleaned bare silicon surfaces is not fully understood. It has been postulated that the reaction path involves a slow nucleophilic attack of OH$^-$ on the Si—H to produce Si—OH, followed by an attack of water on the polarized Si—OH back-bonds. It has also been postulated that starting with a hydrogen terminated surface, the Si—Si back-bond is attacked by the dissolved oxygen via insertion. This allows an OH$^-$ molecule to attack the Si—Si back-bond at the next level below the oxygen insertion. These postulated roles of OH$^-$ in silicon surface etching are supported by the finding that controlling the concentration of OH$^-$ controls the roughness of the surface. Accordingly, a smooth Si(100) surface can be realized in boiling water through controlling the OH$^-$ concentration by lowering the pH level of the solution. The pH level is preferably lowered to 2.5 by adding hydrochloric acid to the deionized water.

A silicon wafer boiled in an aqueous hydrochloric acid solution having a pH level of about 2.5 has no surface roughening when the silicon wafer has been immersed in the boiling aqueous hydrochloric acid solution and drawn from the boiling aqueous hydrochloric acid solution than after the silicon wafer has been cleaned in an aqueous hydrofluoric acid solution. The surface roughening due to the etching reaction can be effectively suppressed by adding a small amount of hydrochloric acid to control the OH$^-$ concentration such that the surfaces of a silicon wafer boiled in aqueous hydrochloric acid have a rms roughness of less than about 0.4 nm.

Various parameters in the disclosure novel process are preferred. A preferred immersion time for a wafer is in the range of about 1 to 20 minutes. A preferred rate at which a wafer is drawn out of the water solution is about 1 to 5 mm/sec. A preferred pH level which minimizes roughening is a range of about 1 to 3 pH.

EXAMPLES OF THE PRESENT INVENTION

A series of experiments were conducted to compare the surface properties of silicon wafers treated by the methods of the present invention with the surface properties of silicon wafers treated by prior art methods of rinsing and drying silicon wafers. More particularly, the surface properties of wafers boiled in an aqueous hydrochloric acid solution having a pH of about 2.5 and wafers boiled in water were compared with the surface properties resulting from treatment in hot water having a temperature of about 80° C. and treatment in room temperature water. The surface properties compared in these series of experiments include the amount of reoxidation and the roughness.

The series of experiments were performed on p-doped (100) Cz silicon wafers with a diameter of 125 mm and a resistivity between 16 to 24 Ω.cm. The wafers first received a SPM+RCA clean which left a chemical oxide on the surface having a thickness of about 1 nm. Before the experiments were performed on the silicon wafers, the wafers were dipped in 0.5% an aqueous HF dip for about 6 minutes to remove the chemical oxide. After standard room temperature deionized water rinsing for a period in the range of about 1 to 10 minutes to strip fluoride residues, the wafers were further immersed in various water solutions, including 80° C. DI water, 100° C. DI water, and 100° C. DI water with an aqueous hydrochloric acid solution. It is desirable to rinse wafers in room temperature DI water for a period in the range of about 1 to 10 minutes to strip fluoride residues, because such a rinse will not cause reoxidation or roughening of the wafer.

EXAMPLE 1

Experiments were conducted to monitor surface reoxidation during rinsing with hot water having a temperature of about 80° C., boiling water, and a boiling aqueous hydrochloric acid solution having a pH level of about 2.5. The surface reoxidation was tested by measuring the contact angle of a droplet of deionized water on the silicon surfaces of the wafers. Measurement of the contact angle of a droplet of deionized water on wafer surfaces has been demonstrated to be a sensitive technique for characterizing surface passivation after HF treatment and to monitor surface reoxidation during the subsequent processes.

The wafers were rinsed for about 15 minutes in the three different rinses. At intervals within the 15 minutes rinse, the contact angle was measured for a droplet of deionized water on the silicon surfaces of the wafers.

It is known that the contact angle changes from 70° to less than 30° when the surface oxygen concentration changes from 0% to near 5%. The contact angle decreased quickly within the 15 minute period as the silicon wafer was immersed in the 80° C. hot water. The contact angle remained at approximately 70° for the boiling water and the boiling aqueous hydrochloric acid solution. The contact angle for the boiling water and the boiling aqueous hydrochloric acid solution indicates that minimal surface reoxidation occurs. The results also indicate that the addition of hydrochloric acid to the boiling water has no effect on the surface oxidation. The results of these experiments are graphically demonstrated in FIG. 1.

EXAMPLE 2

Experiments were conducted to investigate the surface passivation of silicon wafers treated in boiling water, a boiling aqueous hydrochloric acid solution having a pH level of about 2.5, and hot water having a temperature of about 80° C. The surface passivation of the wafers was investigated by making multiple internal reflection (MIR) infrared measurements and then analyzing the silicon hydride stretching modes as well as the relative contributions of the monohydrides, dihydrides and trihydrides. The infrared measurements were performed on a Matsen-Galaxy Fourier Transform Infrared spectroscope (FTIR).

Figure 2:
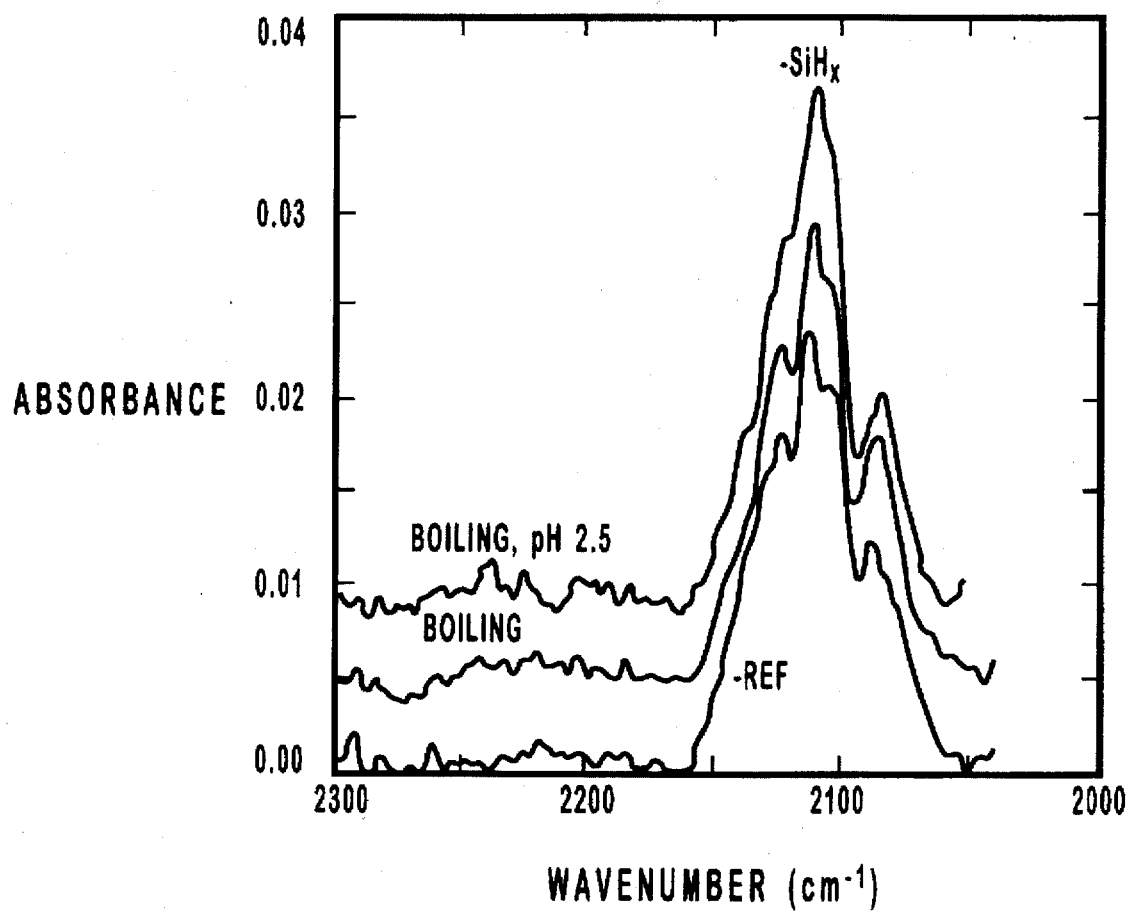
FIG. 2 is a p-polarized multiple internal reflection (MIR) spectra of the Si—H stretch vibration modes of three wafers including a wafer dipped for six minutes in 0.5% HF as a reference, a wafer boiled in water, and a wafer boiled in aqueous hydrochloric acid.

Wafers were boiled in water and in an aqueous solution of hydrochloric acid having a pH of about 2.5 for a period of about 15 minutes. MIR infrared measurements were performed on the FTIR after the wafers were treated for about 15 minutes. MIR infrared measurements were also performed on a wafer dipped for about six minutes in a 0.5 percent HF solution to provide a reference. As shown in FIG. 2, the shape and intensity of the silicon hydride signal remains unaltered after the wafers are treated for about 15 minutes in the boiling water and in the boiling aqueous HCl compared to the reference. FIG. 2 is a p-polarized MIR spectra of the Si-H stretch vibration modes of three wafers including the wafer dipped for 6 minutes in 0.5% HF as a reference, the wafer boiled in water for about 15 minutes, and the wafer boiled in aqueous hydrochloric acid for about 15 minutes. The spectra are shifted along the ordinate for better presentation.

Figure 3:
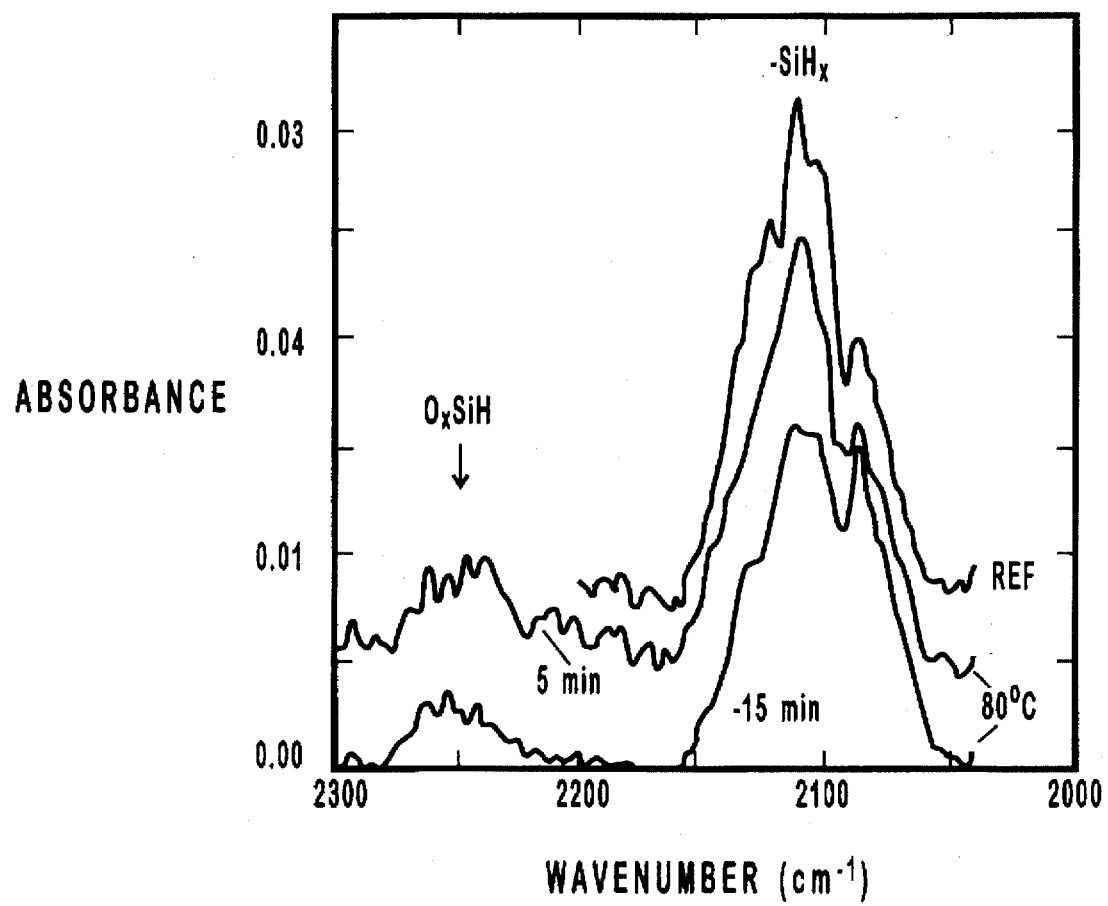
FIG. 3 is p-polarized MIR spectra showing the Si—H stretch modes of three wafers including a wafer dipped for six minutes in 0.5% HF as a reference, a wafer immersed for five minutes in hot water having a temperature of about 80° C., and a wafer immersed for fifteen minutes in hot water having a temperature of about 80° C.

MIR infrared measurements were also performed on three wafers including a wafer dipped for about six 6 minutes in 0.5% HF as a reference, a wafer immersed for about five minutes in hot water having a temperature of about 80° C., and a wafer immersed for about 15 minutes in hot water having a temperature of about 80° C. FIG. 3 is a p-polarized MIR spectra of the Si—H stretch vibration modes of these three wafers as measured in the infrared measurements. The MIR spectra in FIG. 3 show that the intensity of the hydride peaks decrease with immersion time in the 80° C. hot water while the $O_xSiH$ peak can be observed which indicates a fast reoxidation on the surface. The spectra in FIG. 3 are also shifted along the ordinate for better presentation.

EXAMPLE 3

Experiments were conducted to investigate the etching reaction of water on HF cleaned silicon surfaces in room temperature water, boiling water and a boiling aqueous hydrochloric acid solution having a pH level of about 2.5.

Silicon wafers were immersed for about 10 minutes in room temperature water, boiling water, and a boiling aqueous hydrochloric acid solution having a pH level of about 2.5. The microroughness of each wafer after being immersed was directly measured with a Nanoscope II Atomic Force Microscope (AFM). The rms roughness was measured for each of the wafer surfaces and found to be 0.15 nm for the wafer treated in room temperature water, 0.41 nm for the wafer treated in boiling water, and 0.19 nm for the wafer treated in aqueous hydrochloric acid solution.

The roughness measurements indicate that increasing the temperature of the water from room temperature to boiling also increases the microroughness. Obviously, an increase in the temperature enhances the anisotropic etching of the Si(100) surface. The microroughness measurements also indicate that wafers boiled in a solution formed by spiking water with sufficient hydrochloric acid to lower the pH level of the solution to about 2.5 have a microroughness comparable to the microroughness of wafers rinsed in room temperature water.

Figure 4A:
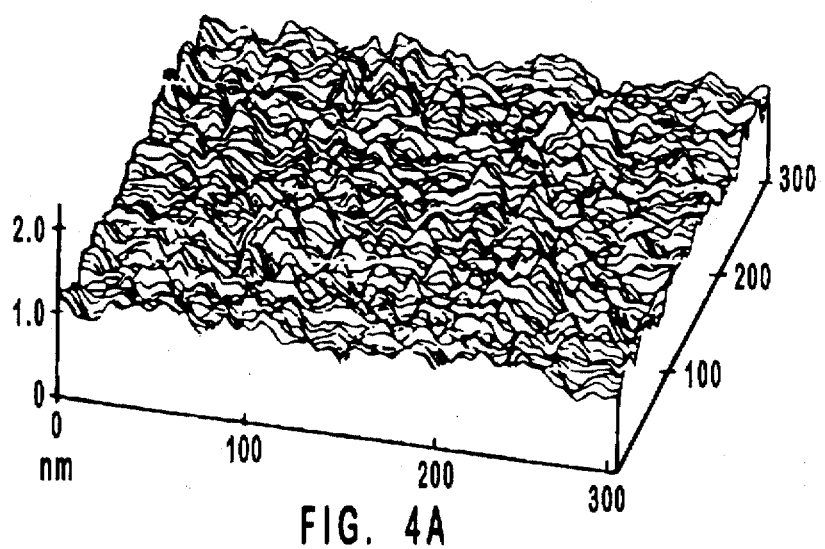
FIG. 4a is a profile of a wafer treated with room temperature water as measured with a Nanoscope II Atomic Force Microscope.
Figure 4B:
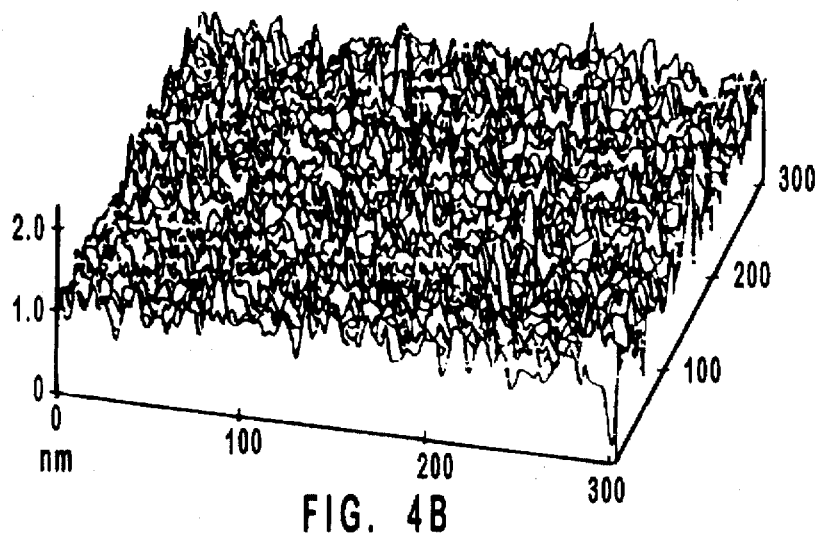
FIG. 4b is a profile of a wafer boiled in water for about ten minutes as measured with a Nanoscope II Atomic Force Microscope.
Figure 4C:
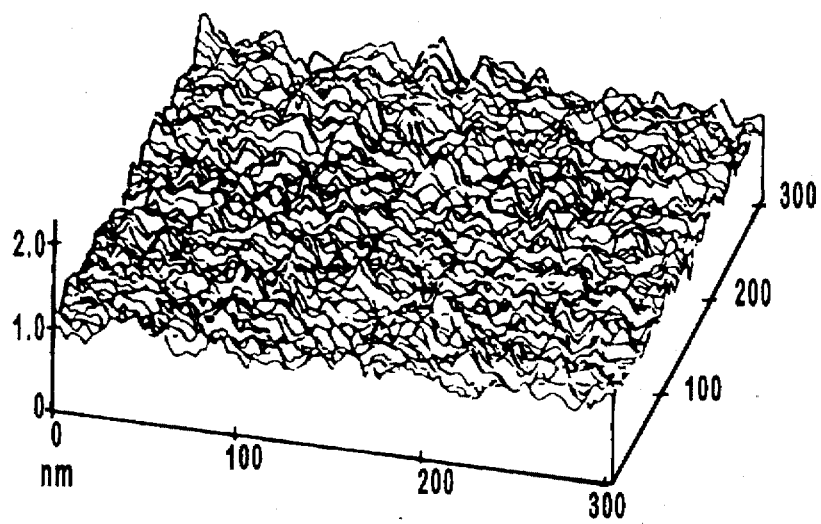
FIG. 4c is a profile of a wafer boiled in aqueous hydrochloric acid for about ten minutes as measured with a Nanoscope II Atomic Force Microscope.

The conclusion based on the rms measurements are supported by FIGS. 4a, 4b, and 4c which are AFM profiles of the wafers. FIG. 4a illustrates the wafer surface morphology of the wafer treated in room temperature water. FIG. 4b illustrates the wafer surface morphology of the surface of the wafer immersed in boiling water for 10 minutes. FIG. 4c illustrates the wafer surface morphology of the surface of the wafer immersed for 10 minutes in the boiling aqueous hydrochloric acid solution having a pH level of about 2.5.

Comparison of FIG. 4a with FIG. 4b indicates that immersion of a silicon wafer in boiling water yields greater microroughness than immersing a silicon wafer in room temperature water. By spiking water with sufficient hydrochloric acid to adjust the pH level to 2.5, the surface roughening of wafers in boiling water is effectively suppressed as indicated by comparing FIG. 4c with 4b.

EXAMPLE 4

Experiments were performed to observe the surface microroughness of silicon wafers rinsed in either room temperature water, boiling water for about ten minutes, or aqueous hydrochloric acid solution having a pH level of about 2.5 for about ten minutes. Information regarding the microroughness of the silicon wafers can be obtained from infrared measurements by observing the relative amounts of monohydrides, dihydrides, and trihydrides on the silicon surfaces.

Figure 5:
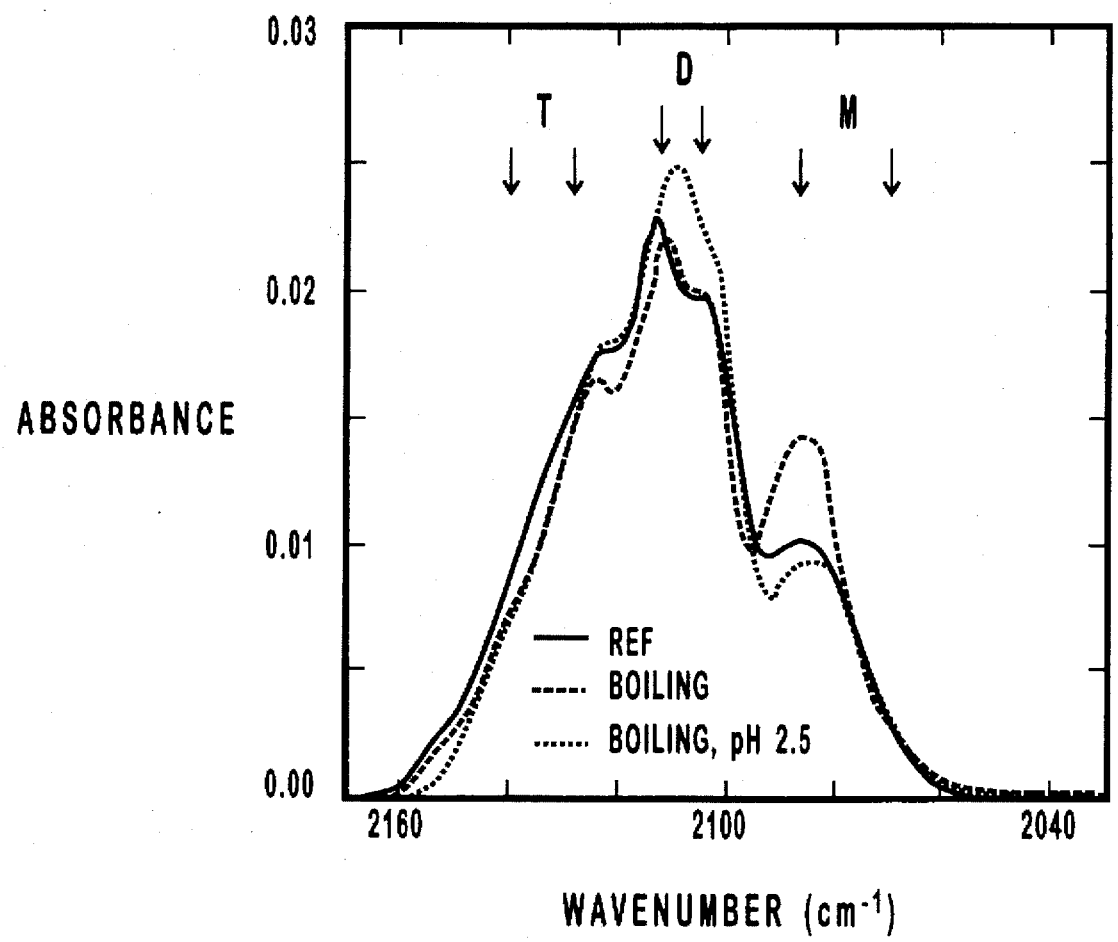
FIG. 5 is a comparison of the Si—H stretch modes of three wafers including a wafer treated in room temperature water, a wafer boiled in water for about ten minutes, and a wafer boiled in an aqueous hydrochloric acid solution having a pH level of about 2.5 for about ten minutes. The vibration modes of the monohydrides, dihydrides and trihydrides are indicated, respectively, as M, D, T.

The MIR spectra obtained from the silicon wafers are shown in FIG. 5. The monohydride, dihydride, and trihydride peak positions are indicated by the arrows with either an M, D, or T. A much higher monohydride peak is observed for the silicon wafer treated in boiling water than is observed for the wafers treated in room temperature water or in the boiling aqueous hydrochloric acid solution. This indicates an increase in (111) facets due to the anisotropic etching of the Si(100) surface by the OH$^-$. Accordingly, a smoother surface is obtained when a wafer is boiled in an aqueous hydrochloric acid solution than is obtained when a wafer is boiled in water.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of rinsing and drying of a silicon wafer comprising
   cleaning the silicon wafer in an aqueous hydrofluoric acid solution;
   immersing the silicon wafer in a boiling aqueous hydrochloric acidic solution; and
   drawing the silicon wafer from the boiling aqueous hydrochloric acidic solution to dry in ambient air.

2. A method of rinsing and drying of a silicon wafer as defined in claim 1, wherein the silicon wafer has surfaces thereon, and immersing the silicon wafer in the boiling aqueous hydrochloric acid solution minimizes oxidation of the surfaces of the silicon wafer.

3. A method of rinsing and drying of a silicon wafer as defined in claim 1, wherein the silicon wafer has substantially no more oxides on the surfaces of the silicon wafer after the silicon wafer has been immersed in the boiling aqueous hydrochloric acid solution and drawn from the boiling aqueous hydrochloric acid solution than after the silicon wafer has been cleaned in an aqueous hydrofluoric acid solution.

4. A method of rinsing and drying of a silicon wafer as defined in claim 1, wherein the surfaces of the silicon wafer are substantially oxide free after the silicon wafer has been immersed in the boiling aqueous hydrochloric acid solution and drawn from the boiling aqueous hydrochloric acid solution.

5. A method of rinsing and drying of a silicon wafer as defined in claim 1, wherein the surfaces of the silicon wafer are sufficiently oxide free, whereby a droplet of deionized water on one of the surfaces of the silicon wafer has a contact angle of about 70° after the silicon wafer has been immersed in the boiling aqueous hydrochloric acid solution and drawn from the boiling aqueous hydrochloric acid solution.

6. A method of rinsing and drying of a silicon wafer as defined in claim 1, wherein the silicon wafer has substantially no more microroughness on the surfaces of the silicon wafer after the silicon wafer has been immersed in the boiling aqueous hydrochloric acid solution and drawn from the boiling aqueous hydrochloric acid solution than after the silicon wafer has been cleaned in an aqueous hydrofluoric acid solution.

7. A method of rinsing and drying of a silicon wafer having surfaces thereon, comprising:

cleaning the silicon wafer in an aqueous hydrofluoric acid solution;

immersing the silicon wafer in a boiling aqueous hydrochloric acidic solution having a pH level of about 2.5; and drawing the silicon wafer from the boiling aqueous hydrochloric acidic solution to dry in ambient air.

8. A method of rinsing and drying of a silicon wafer as defined in claim 7, wherein immersing the silicon wafer in the boiling aqueous hydrochloric acid solution minimizes oxidation of the surfaces of the silicon wafer.

9. A method of rinsing and drying of a silicon wafer as defined in claim 7, wherein the silicon wafer substantially has no more oxides on the surfaces of the silicon wafer after the silicon wafer has been immersed in the boiling aqueous hydrochloric acid solution and drawn from the boiling aqueous hydrochloric acid solution than after the silicon wafer has been cleaned in an aqueous hydrofluoric acid solution.

10. A method of rinsing and drying of a silicon wafer as defined in claim 7, wherein the surfaces of the silicon wafer are sufficiently oxide free, whereby a droplet of deionized water on one of the surfaces of the silicon wafer has a contact angle of about 70° after the silicon wafer has been immersed in the boiling aqueous hydrochloric acid solution and drawn from the boiling aqueous hydrochloric acid solution.

11. A method of rinsing and drying of a silicon wafer as defined in claim 7, wherein the silicon wafer has substantially no more microroughness on the surfaces of the silicon wafer after the silicon wafer has been immersed in the boiling aqueous hydrochloric acid solution and drawn from the boiling aqueous hydrochloric acid solution than after the silicon wafer has been cleaned in an aqueous hydrofluoric acid solution.

12. A method of rinsing and drying of a silicon wafer having surfaces thereon, comprising:

cleaning the silicon wafer in an aqueous hydrofluoric acid solution;

immersing the silicon wafer in a boiling aqueous hydrochloric acidic solution having a pH level of about 2.5 for a predetermined time sufficient to remove oxide from the surfaces of the silicon wafer, whereby the surfaces of the silicon wafer have a rms roughness of less than about 0.4 nm; and drawing the silicon wafer from the boiling aqueous hydrochloric acidic solution to dry in ambient air, whereby a droplet of deionized water on one of the surfaces of the silicon wafer has a contact angle of about 70°.

* * * * *

UNITED STATES PATENT AND TRADEMARK OFFICE
CERTIFICATE OF CORRECTION

PATENT NO. : 5,681,397

DATED : Oct. 28, 1997

INVENTOR(S) : Li Li

Page 1 of 2

It is certified that error appears in the above-identified patent and that said Letters Patent is hereby corrected as shown below:

Title page, item [56] change "Nayami et al, Removal of Metallic contaminants and Native oxide Prom silicon wafer surface by pure water containing a little dissolved Oxygen Mat. Res. Soc. Symp. Proc..." to --Nayami et al, Removal of Metallic Contaminants and Native Oxide from Silicon Wafer Surface by Pure Water Containing a Little Dissolved Oxygen Mat. Res. Soc. Symp. Proc..."

Cover Page, Other Publications, please insert the following references:

J.H. Eisenbeerg et al, Effect of Hot Water Exposure On Bare Silicon Surfaces in MOS Processing, PP 485-490; Mat. Res. Soc. Symp, Proc; Vol. 315 (1993)

L. Li, G. Zou, H. Bender, P.W. Mertens, M. Meuris, H.F. Schmidt and M.M. Heyns; Proceedings of the Second International Symposium on Ultra-Clean Processing of Silicon Surfaces; PP 167-170; (Sept. 17, 1994)

Col. 4, line 23, after "in" change "aa" to --an--

Col. 5, line 25, after "no" insert --more--

Col. 5, line 26, after "roughening" insert --than--

Col. 5, line 55, after "in" change "these" to --this--

Col. 5, line 59, before "The" change ".cm" to -- cm--

Col. 5, line 63, after "0.5%" insert --of--

UNITED STATES PATENT AND TRADEMARK OFFICE
CERTIFICATE OF CORRECTION

PATENT NO. : 5,681,397

DATED : Oct. 28, 1997

INVENTOR(S) : Li Li

It is certified that error appears in the above-identified patent and that said Letters Patent is hereby corrected as shown below:

Col. 6, line 21, after "15" change "minutes" to --minute--

Signed and Sealed this

Thirtieth Day of March, 1999

Attest:

Attesting Officer

Q. TODD DICKINSON

Acting Commissioner of Patents and Trademarks